United States Patent
Jia et al.

(10) Patent No.: US 10,276,835 B2
(45) Date of Patent: Apr. 30, 2019

(54) FILLING APPARATUS USED IN AN EVAPORATOR SYSTEM AND FILLING METHOD

(71) Applicant: BOE TECHNOLOGY GROUP CO., LTD., Beijing (CN)

(72) Inventors: Wenbin Jia, Beijing (CN); Xinwei Gao, Beijing (CN); Ronggang Shangguan, Beijing (CN); Xinxin Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 121 days.

(21) Appl. No.: 15/085,050

(22) Filed: Mar. 30, 2016

(65) Prior Publication Data

US 2017/0077458 A1 Mar. 16, 2017

(30) Foreign Application Priority Data

Sep. 14, 2015 (CN) .......................... 2015 1 0582070

(51) Int. Cl.
*C23C 14/24* (2006.01)
*H01L 51/56* (2006.01)

(52) U.S. Cl.
CPC .............. *H01L 51/56* (2013.01); *C23C 14/24* (2013.01); *H01L 2251/56* (2013.01)

(58) Field of Classification Search
CPC ..... H01L 51/56; H01L 2251/56; C23C 14/24; C23C 14/12
USPC ... 141/21, 34, 336, 335, 334, 333, 332, 331; 251/129.21
See application file for complete search history.

(56) References Cited

U.S. PATENT DOCUMENTS

| 1,342,641 | A | * | 6/1920 | Moreton | ............. | F16K 31/0651 |
| | | | | | | 251/129.21 |
| 3,258,166 | A | * | 6/1966 | Kuckens | .................. | B67D 3/00 |
| | | | | | | 222/479 |
| 3,476,355 | A | * | 11/1969 | Sherwood | ........... | F16K 31/0682 |
| | | | | | | 251/65 |

(Continued)

FOREIGN PATENT DOCUMENTS

CN 2767104 Y 3/2006
CN 101023196 A 8/2007
(Continued)

OTHER PUBLICATIONS

Chinese office action dated Apr. 29, 2016.
(Continued)

*Primary Examiner* — Jason K Niesz
*Assistant Examiner* — James R Hakomaki
(74) *Attorney, Agent, or Firm* — Dilworth & Barrese, LLP; Michael J. Musella, Esq.

(57) ABSTRACT

A filling apparatus used in an evaporator system and a filling method are provided. The filling apparatus includes: a filling bottle, a magnetic cover plate, an evaporation material trough and a magnetic induction drive unit, wherein the magnetic cover plate is provided at an opening of the filling bottle, in operation the opening of the filling bottle is provided to orientate the evaporation material trough, the magnetic induction drive unit is disposed outside of the opening, and configured to be capable of driving the magnetic cover plate to open and close.

15 Claims, 2 Drawing Sheets

(56) References Cited

U.S. PATENT DOCUMENTS

| | | | |
|---|---|---|---|
| 3,586,067 A * | 6/1971 | Bye-Jorgensen | B65B 1/18 141/12 |
| 3,974,854 A * | 8/1976 | Kurpanek | A61F 2/2403 137/512 |
| 3,995,661 A * | 12/1976 | Van Fossen | F16K 1/22 251/65 |
| 4,381,703 A * | 5/1983 | Crimmins | A01C 1/02 177/147 |
| 4,605,408 A * | 8/1986 | Carpentier | A61F 2/2403 251/65 |
| 4,630,799 A * | 12/1986 | Nolan | F16K 31/082 137/460 |
| 5,033,419 A * | 7/1991 | Plohberger | F02B 25/00 123/73 PP |
| 5,135,538 A * | 8/1992 | Pawlak | A61F 2/2406 137/512 |
| 2006/0062918 A1 | 3/2006 | Long et al. | |
| 2009/0114665 A1 * | 5/2009 | Ogawa | B65G 47/1421 221/2 |
| 2012/0052189 A1 * | 3/2012 | Liu | C23C 14/044 427/8 |

FOREIGN PATENT DOCUMENTS

| | | | |
|---|---|---|---|
| CN | 102011096 A | | 4/2011 |
| CN | 201866343 U | * | 6/2011 |
| CN | 10235083 A | | 2/2012 |
| CN | 103866318 A | | 6/2014 |
| CN | 103950854 A | | 7/2014 |
| CN | 101736293 A | | 6/2016 |

OTHER PUBLICATIONS

Chinese office action dated Oct. 25, 2016.
Report and Written Opinion dated Feb. 4, 2016 from State Intellectual Property Office of the P.R. China.

* cited by examiner

FILLING APPARATUS USED IN AN EVAPORATOR SYSTEM AND FILLING METHOD

TECHNICAL FIELD

Embodiments of the present invention relate to a filling apparatus used in an evaporator system and a filling method.

BACKGROUND

At present, in an evaporation process for an OLED (organic light emitting diode), filling becomes a basic step, in an evaporation process of a traditional large size OLED, after a metal material and an organic material being filled in an atmosphere, then put the metal material and the organic material in an organic chamber for evaporation. However, in the process of evaporation, the organic material is easy to react with oxygen and water vapor in the atmosphere, and the organic material is easily deliquesces at the same time of oxidation and the purity of the organic material is affected. Especially the active metal material is too active, an oxide layer is easy to form on the surface of a metal ball or a metal block, and the oxide layer is unfavorable for an evaporation electrode, an evaporation temperature is increased while the purity of an evaporation metal is declining. For example, in the preparation of the WOLED (white organic light emitting diode), n-CGL (n type doping charge generation layer) often uses lithium metal doping, lithium is easy to react with oxygen and nitrogen in the atmosphere to form lithium oxide and lithium nitride. To solve the problems that exposed in air, a method of manipulator filling in the vacuum is usually used, or the method of shorten the filling time as much as possible is used. However, the mechanical filling equipment used in the first method is expensive and complex, and greatly increases the cost; the second method just shortens the time of contacting with the atmosphere and cannot solve the problem of metal oxide in a thorough way.

SUMMARY

Embodiments of the present disclosure provide a filling apparatus used in an organic light emitting diode evaporator system and a filling method.

An embodiment of the present disclosure provides a filling apparatus configured to be used in an evaporator system, comprising: a filling bottle, a magnetic cover plate, an evaporation material trough and a magnetic induction drive unit, wherein the magnetic cover plate is provided at an opening of the filling bottle, in operation the opening of the filling bottle is provided to orientate the evaporation material trough, the magnetic induction drive unit is disposed outside of the opening, and configured to be capable of driving the magnetic cover plate to open and close. In some embodiment of the present disclosure, the magnetic cover plate is hinged at the opening of the filling bottle.

On the other hand, an embodiment of the disclosure provides a filling method used in an evaporator system, comprising the following steps:
 filling an evaporation material in the filling bottle;
 disposing the filling bottle upside-down on an evaporation material trough in a vacuum evaporation space, and orientating the opening of the filling bottle to the evaporation material trough;
 attracting a magnetic cover plate provided at an opening of the filling bottle through a magnetic induction drive unit to open the magnetic cover plate and to fill the evaporation material into the evaporation material trough;
 after filling of the material from the filling bottle into the evaporation material trough is conducted, changing the direction of an magnetic field generated by the magnetic induction drive unit to close the magnetic cover plate.

In some embodiments, an inert gas is filled in the filling bottle in a sealed state to discharge air in the filling bottle before the evaporation material is filled in the filling bottle.

In some embodiments, the vacuum evaporation space is vacuumed until a subatmospheric pressure opens the magnetic cover plate, then the magnetic cover plate is attracted by the magnetic induction drive unit to fully open the magnetic cover plate.

In some embodiments, the direction of the magnetic field generated by the magnetic induction drive unit is changed to repulse back and close the magnetic cover plate.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

Figure 1:
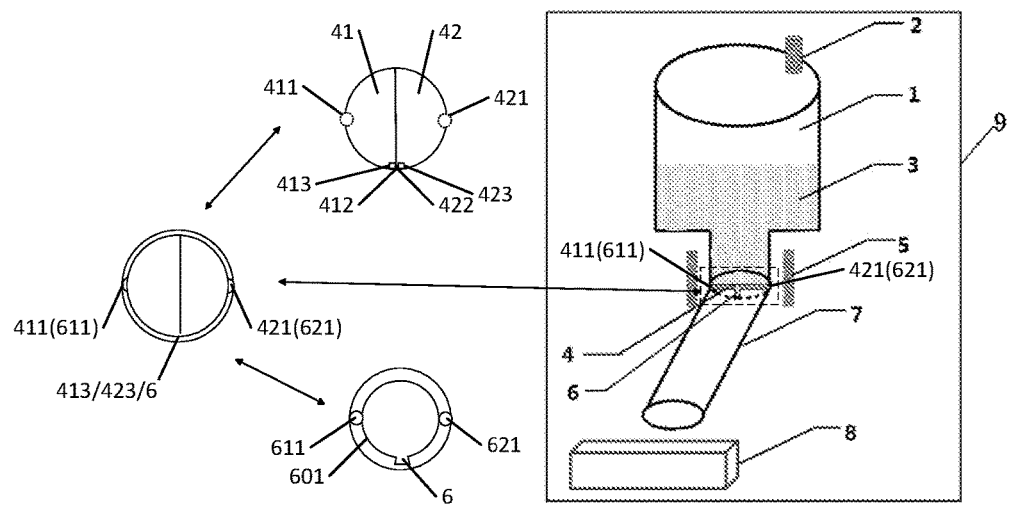
FIG. 1 is a structure schematic view of a filling apparatus used in an evaporator system according to an embodiment of the present disclosure.

In the figures, reference signs have the following meanings:
1: filling bottle; 2: gas filling hole; 3: evaporation material; 4: magnetic cover plate; 5: electromagnet; 6: chute; 7: drainage tube; 8: evaporation material trough; 9: vacuum evaporation space.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

In the description of the disclosure, what need to understand is: the terms "center", "up", "down", "vertical", "horizontal", "top", "bottom", "inside" and "outside" etc indicating the location or position relations based on the location or position shown in the drawings only for the purposes of describing the disclosure and simplified the description, rather than indicate or suggest the devices or components must have a specific location, constructed and operated in a specific location, therefore, can't understand for limiting the disclosure. Besides, the terms "first", "second" are only used for the purposes of describing the disclosure and can't understand for indicating or suggesting the relative importance.

In the description of the present disclosure, it's to be noted that, unless otherwise clearly regulations and limitations, the terms "install", "connect", "connected" should be understood in a board sense, for example, it can be a constant connection, it can also be a detachable connection or an integrally connection; it can be a mechanical connection or an electrical connection; it can be a directly connection or an indirectly connection through an intermediation, or the inside connection of two elements. For those ordinary skilled in the art, the specific meaning of the term in the disclosure can be understood according to the specific circumstance.

Embodiments of the present disclosure provide a filling apparatus configured to be used in an organic light emitting diode evaporator system and a filling method. With the apparatus or the method used in the evaporation technology, the metal material and the organic material is prevented from reacting with oxygen and water vapor in the atmosphere in the process of putting the metal material and the organic material in an organic chamber, therefore the purity and the evaporation temperature of the materials would not be affected.

The filling apparatus used in an evaporator system comprises: a filling bottle, a magnetic cover plate, an evaporation material trough and a magnetic induction drive unit, wherein the magnetic cover plate is provided at (for example, but not limited to, hinged at) an opening of the filling bottle, in operation the opening of the filling bottle is provided to orientate the evaporation material trough, and the magnetic induction drive unit is disposed outside of the opening, and configured to be capable of driving the magnetic cover plate to open and close. In some embodiments, the filling apparatus may be disposed in a vacuum evaporation space.

In some embodiments, the filling apparatus further comprising: a drainage tube, wherein an end of the drainage tube is connected to the opening of the filling bottle, other end of the drainage is provided to orientate the evaporation material trough in operation.

In some embodiments, the magnetic cover plate comprises two symmetrical permanent magnet plates, an end of each of the permanent magnet plates is hinged at the opening, and other end of each of the permanent magnet plates snap-fits the opening.

In some embodiments, both of the two permanent magnet plates are semicircular, and diameter sides of the two permanent magnet plates are capable of being moved to abut each other; a top end of an arc side of each of the permanent magnet plates is hinged at the opening.

In some embodiments, a region of the arc side of each of the permanent magnet plates, which region is close to the diameter side of the each of the permanent magnet plates, can be snap-fitted at the opening.

In some embodiments, a chute is formed in the inner wall of the opening, the arc side of each of the permanent magnet plates has a protrusion matching the chute to allow the permanent magnet plates to be snap-fitted within the chute at the opening.

In some embodiments, the magnetic induction drive unit comprises a pair of electromagnets, the electromagnets are disposed next to two sides of the opening respectively, and are configured that the electromagnets generate a magnetic field upon the electromagnets being electrified, and the permanent magnet plates are located in the magnetic field.

In some embodiments, a gas filling hole is formed at the bottom of the filling bottle.

In some embodiments, in operation the opening of the filling bottle is provided to orientate downward.

In some embodiments, the filling bottle is disposed over the evaporation material trough. In the embodiment, the filling bottle is disposed upside-down over the evaporation material trough in the vacuum evaporation space.

In some embodiments, the evaporator system is an evaporator system configured for fabricating an organic light emitting diode.

On the other hand, an embodiment of the disclosure provides a filling method used in an evaporator system, comprising the following steps:

S1. filling an inert gas in a filling bottle in a sealed state to discharge air in the filling bottle;

S2. filling an evaporation material in the filling bottle;

S3. disposing the filling bottle upside-down on an evaporation material trough in a vacuum evaporation space, and orientating the opening of the filling bottle to the evaporation material trough;

S4. vacuuming the vacuum evaporation space until the negative pressure opens a magnetic cover plate hinged at an opening of the filling bottle;

S5. attracting the magnetic cover plate through a magnetic induction drive unit to fully open the magnetic cover plate and to fill the evaporation material into the evaporation material trough;

S6. after filling of the material from the filling bottle into the evaporation material trough is complete, changing the direction of an magnetic field generated by the magnetic induction drive unit to repulse back and close the magnetic cover plate.

In some embodiments, the evaporation material comprises an evaporation organic material or an active metal.

In some embodiments, in step S3, an end of the drainage tube is connected with the opening of the filling bottle, other end of the drainage tube orientates the evaporation material trough; in step S5, the evaporation material enters into the evaporation material trough through the drainage tube.

The technical solutions of the disclosure have the following advantages: with the filling apparatus used in the evaporator system (for example, an evaporator system for fabricating an organic light emitting diode) and the filling method according to the present disclosure, the magnetic cover plate is hinged at the opening of the filling bottle, the magnetic induction drive unit is disposed outside of the opening, and configured to be capable of driving the magnetic cover plate to open and close to realize the function of real time and continuous quantitative filling, thus more evaporation materials can be placed in the filling bottle in one time, and it is not necessary to fill the evaporation materials from the outside of the vacuum evaporation space to the inside of the evaporation material trough for more than one time, and prevent the evaporation material from reacting with oxygen and water vapor in the atmosphere in the process of putting the evaporation material in an organic chamber, and in turn avoid the problems of affecting the purity and the evaporation temperature of the evaporation materials.

First Embodiment

Figure 2:
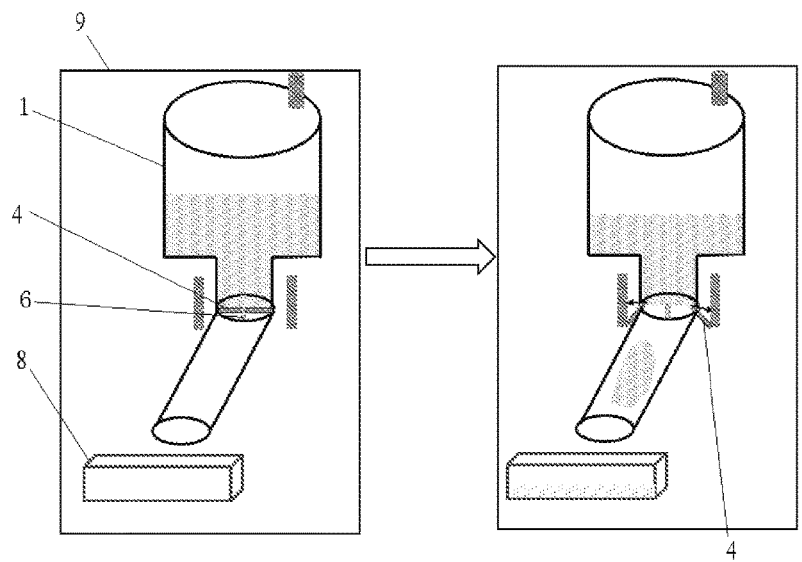
FIG. 2 is a schematic view of a filling apparatus used in an evaporator system the magnetic cover open and start filling according to an embodiment of the present disclosure.
Figure 3:
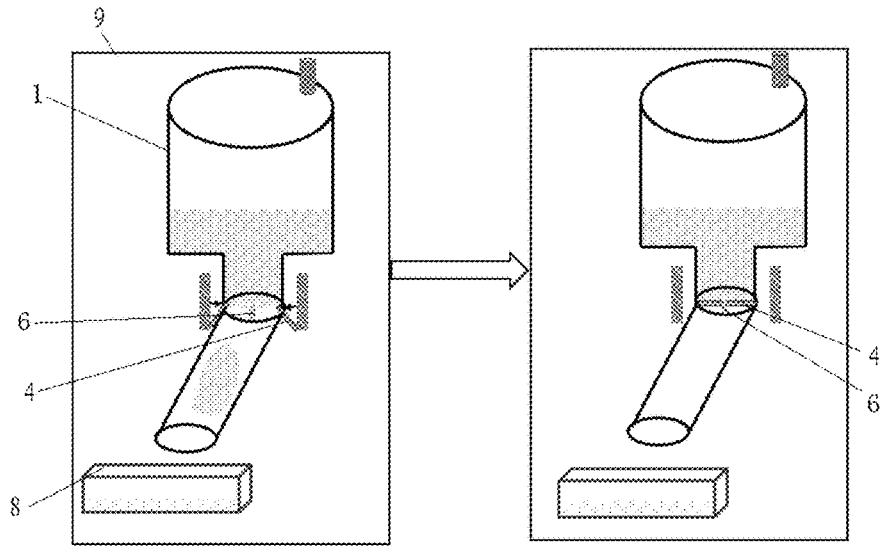
FIG. 3 is a schematic view of a filling apparatus used in an evaporator system the magnetic cover close and finish filling according to an embodiment of the present disclosure.

As shown in FIG. 1, FIG. 2 and FIG. 3, the first embodiment of the disclosure provides a filling apparatus used in an organic light emitting diode evaporator system, comprising:

a filling bottle 1, a magnetic cover plate 4, an evaporation material trough 8 and a magnetic induction drive unit (for example an electromagnet 5) which are disposed in a vacuum evaporation space 9, wherein the opening of the filling bottle 1 orientates downwards, the magnetic cover plate 4 is hinged at an opening of the filling bottle 1, the opening of the filling bottle 1 orientates the evaporation material trough 8, the magnetic induction drive unit is disposed outside of the opening, and configured to be capable of driving the magnetic cover plate 4 to open and close, the filling bottle 1 can be made of a high strength polymer and a glass, wherein, the magnetic cover plate 4 is a permanent magnet board.

In the embodiment, the filling bottle 1 is filled with an evaporation material 3, and the evaporation material 3 is usually an evaporation organic material or an active metal. The filling bottle 1 is sealed by the magnetic cover plate 4, the magnetic cover plate 4 is hinged at an opening of the filling bottle 1, in the process of vacuuming the vacuum evaporation space 9, using the pressure difference of the inside and outside of the filling bottle 1 the magnetic cover plate 4 can be slightly opened, because the magnetic induction drive unit is disposed outside of the opening, under the driving effect of the magnetic induction drive unit, the magnetic cover plate 4 located in the magnetic field of the magnetic induction drive unit is attracted by the magnetic induction drive unit to fully open the magnetic cover plate. The evaporation organic material or the active metal smoothly enters into the evaporation material trough 8 for evaporation. After completing the filling, changing the magnetic field direction of the magnetic induction drive unit, the magnetic cover plate 4 close, in this way the magnetic cover plate 4 is controlled to open and close through the magnetic induction drive unit to realize the function of real time and continuous quantitative filling, and in the process, more metal materials and organic materials can be put into the filling bottle 1 in one time, and it is not necessary to fill the evaporation materials 3 from the outside of the vacuum evaporation space 9 to the inside of the evaporation material trough 8 for more than one time, and prevent the evaporation materials 3 from reacting with oxygen and water vapor in the atmosphere in the process of putting the evaporation materials 3 in an organic chamber, and in turn avoid the problems of affecting the purity and the evaporation temperature of the materials.

Further, the filling apparatus further comprises a drainage tube 7, an end of the drainage tube 7 is connected to the opening of the filling bottle 1, other end of the drainage tube 7 orientates the evaporation material trough 8; by setting the drainage tube 7, the evaporation materials 3 can be lead from the filling bottle 1 to the evaporation material trough 8 to facilitate a transfer of the evaporation materials 3.

Specifically, the magnetic cover plate 4 comprises two symmetrical permanent magnet plates, an end of each of the permanent magnet plates is hinged at the opening, other end of each of the permanent magnet plates snap-fits the opening; the two permanent magnet plates cooperate with the magnetic induction drive unit to drive the magnetic cover plate to open and close more easily and conveniently.

In some embodiments, as shown in FIG. 1, the two permanent magnet plates 41/42 (i.e., magnetic cover plate 4) are semicircular, and their diameter sides can abut; a top end 411/421 of an arc side of each of the permanent magnet plates are hinged at the opening by the attendant hinges 611/621 on the opening matching with the attendant hinges on top end 411/421, a region 412/422 of the arc side of each of the permanent magnet plates that is close to the diameter side can snap-fitted at the opening. When the opening of the filling bottle 1 is a circular, the permanent magnet plates are designed as semicircular, the snap-fit method of the permanent magnet plates and the opening is more reasonable.

Specifically, a chute 6 is formed in the inner wall 601 of the opening, the arc side of each of the permanent magnet plates has a protrusion 413/423 matching the chute 6 to allow the per magnet plates to be snap-fitted within the chute at the opening; the magnetic induction drive unit comprises a pair of electromagnets 5, the two electromagnets 5 are disposed next to two sides of the opening respectively, and are configured that the electromagnets 5 generate a magnetic field upon the electromagnets 5 are electrified, and the permanent magnet plates (i.e. the magnetic cover plate 4) are located in the magnetic field. By disposing the electromagnets 5 and the permanent magnet plates and using the vacuum difference between the sealed filling bottle and the vacuum evaporation space 9 to open the magnetic cover plate 4 from inside to the outside, and an electromagnet 5 is provided next to the filling bottle, the direction and the magnitude of the magnetic field are changed by controlling the direction and size of current to attract and repulse the magnetic cover plate 4, which can realize the functions of real time and continuous quantitative filling.

Further, a gas filling hole 2 is formed at the bottom of the filling bottle 1, the gas filling hole 2 can be sealed and inert gas can be filled into the filling bottle 1 easily.

Second Embodiment

Figure 4:
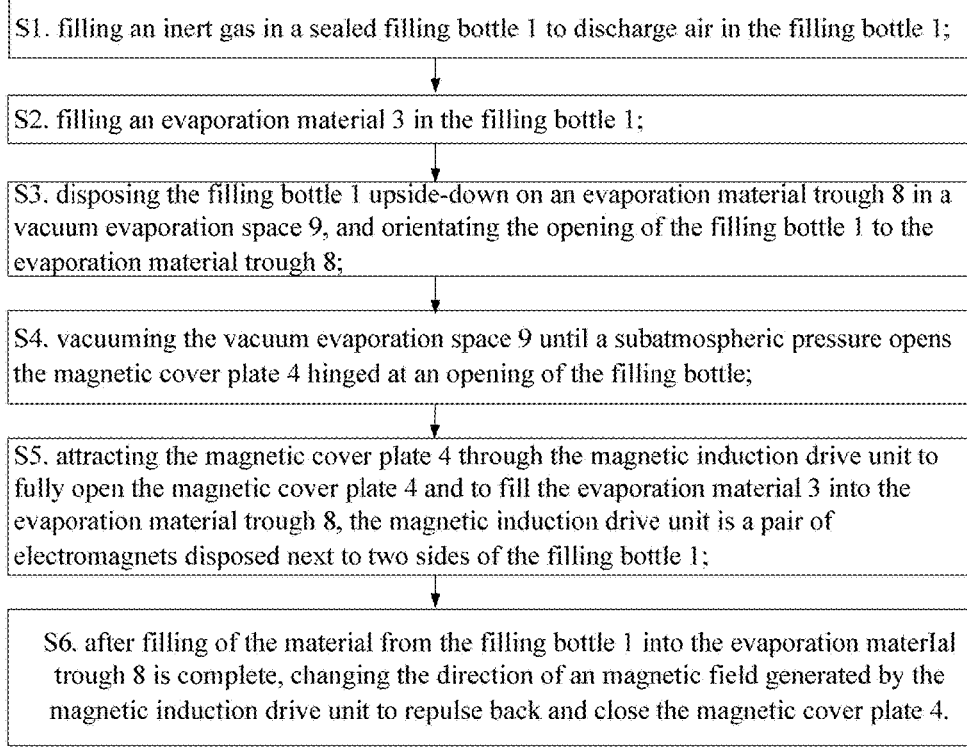
FIG. 4 is an operation flow diagram of a filling method used in an evaporator system according to an embodiment of the present disclosure.

The second embodiment of the disclosure provides a filling method used in an organic light emitting diode evaporator system which adopts the filling apparatus in the first embodiment, as shown in FIG. 4, the filling method includes the following steps:

S1. filling an inert gas in a sealed filling bottle 1 to discharge air in the filling bottle 1;

S2. filling an evaporation material 3 in the filling bottle 1;

S3. disposing the filling bottle 1 upside-down on an evaporation material trough 8 in a vacuum evaporation space 9, and orientating the opening of the filling bottle 1 to the evaporation material trough 8;

S4. vacuuming the vacuum evaporation space 9 until a subatmospheric pressure opens the magnetic cover plate 4;

S5. attracting the magnetic cover plate 4 through the magnetic induction drive unit to fully open the magnetic cover plate 4 and to fill the evaporation material 3 into the evaporation material trough 8, the magnetic induction drive unit comprises a pair of electromagnets disposed next to two sides of the filling bottle 1;

S6. after filling of the material from the filling bottle 1 into the evaporation material trough 8 is complete, changing the direction of an magnetic field generated by the magnetic induction drive unit to repulse back and close the magnetic cover plate 4.

In the case that the filling of the material is complete, the direction of the magnetic field is changed by applying enough reverse current to both sides of the electromagnet 5, to repulse the two permanent magnets (the magnetic cover plate 4), and make the magnetic cover plate can snap-fit the chute to end the filling.

In the method, the magnetic cover plate 4 used to seal the opening and the chute are separated by the vacuum difference between the sealed filling bottle and the vacuum evaporation space, to start the filling, and at the same time, the two permanent magnets on the opening of the filling bottle are attracted by the magnetic field generated by the electromagnets 5 to fully open the permanent magnets; after filling of the material, changing the direction of the magnetic field 5 to repulse the permanent magnets, make the permanent magnets back to the original location and end the filling, the method can realize the function of real time and quantitative filling.

Specifically, the evaporation material 3 is an evaporation organic material or an active metal; in step S3, an end of the drainage tube 7 is connected with the opening of the filling bottle 1, other end of the drainage tube orientates the evaporation material trough 8; in step S5, the evaporation material 3 enters into the evaporation material trough 8 through the drainage tube 7. The transfer of the evaporation material 3 is facilitated by the drainage tube 7.

In summary, with the filling apparatus used in the organic light emitting diode evaporator system and the filling method provided by the present disclosure, the magnetic cover plate 4 is hinged at the opening of the filling bottle 1, a pair of electromagnets 5 are disposed at the opening of the filling bottle 1, the magnetic cover plate 4 is driven to open and close by the electromagnets 5 to realize the function of real time and continuous quantitative filling, thus more metal material and the organic material can be put in the filling bottle in one time, and it is not necessary to fill the evaporation materials 3 from the outside of the vacuum evaporation space 9 to the inside of the evaporation material trough 8 for more than one time, and prevent the evaporation materials 3 from reacting with oxygen and water vapor in the atmosphere in the process of putting the evaporation materials 3 in an organic chamber, and in turn avoid the problems of affecting the purity and the evaporation temperature of the evaporation materials.

What are described above is related to the illustrative embodiments of the disclosure only and not limitative to the scope of the disclosure; the scopes of the disclosure are defined by the claims.

The present application claims the priority of the Chinese Patent Application No. 201510582070.7 filed on Sep. 14, 2015, which is incorporated herein by reference as part of the disclosure of the present application.

What is claimed is:

1. A filling apparatus configured to be used in an evaporator system, comprising: a filling bottle, a magnetic cover plate, an evaporation material trough and a magnetic induction drive unit,
   wherein the magnetic cover plate is provided at an opening of the filling bottle, in operation the opening of the filling bottle is provided to orientate the evaporation material trough, and the magnetic induction drive unit is disposed outside of the opening and configured to drive the magnetic cover plate to open and close;
   the magnetic cover plate comprises two symmetrical permanent magnet plates, an end of each of the permanent magnet plates is hinged at the opening, and other end of each of the permanent magnet plates snap-fits the opening;
   wherein the two permanent magnet plates are semicircular, and diameter sides of the two permanent magnet plates are movable to abut each other; a top end of an arc side of each of the permanent magnet plates is hinged at the opening; and
   a region of the arc side of each of the permanent magnet plates, which region is close to the diameter side of the each of the permanent magnet plates, is snap-fitted at the opening.

2. The filling apparatus according to claim 1, further comprising a drainage tube, wherein an end of the drainage tube is connected to the opening of the filling bottle, other end of the drainage tube is provided to orientate the evaporation material trough in operation.

3. The filling apparatus according to claim 1, wherein a chute is formed in the inner wall of the opening, the arc side of each of the permanent magnet plates has a protrusion matching the chute to allow the permanent magnet plates to be snap-fitted within the chute at the opening.

4. The filling apparatus according to claim 1, wherein the magnetic induction drive unit comprises a pair of electromagnets, the electromagnets are disposed next to two sides of the opening respectively, and are configured that the electromagnets generate a magnetic field upon the electromagnets being electrified, and the permanent magnet plates are located in the magnetic field.

5. The filling apparatus according to claim 4, wherein a gas filling hole is formed at a bottom of the filling bottle.

6. The filling apparatus according to claim 1, wherein in operation the filling bottle is disposed over the evaporation material trough, and the opening of the filling bottle is provided to orientate downward.

7. The filling apparatus according to claim 1, wherein the filling bottle is disposed over the evaporation material trough.

8. A filling method used in an evaporator system, comprising the following steps:
   filling an evaporation material in a filling bottle;
   disposing the filling bottle upside-down on an evaporation material trough in a vacuum evaporation space, and orientating an opening of the filling bottle to the evaporation material trough;
   attracting a magnetic cover plate provided at an opening of the filling bottle through a magnetic induction drive unit that is disposed outside of the opening to open the magnetic cover plate and to fill the evaporation material into the evaporation material trough;
   after filling of the material from the filling bottle into the evaporation material trough is conducted, changing a direction of an magnetic field generated by the magnetic induction drive unit to close the magnetic cover plate;
   wherein the magnetic cover plate comprises two symmetrical permanent magnet plates, an end of each of the permanent magnet plates is hinged at the opening, and other end of each of the permanent magnet plates snap-fits the opening;
   the two permanent magnet plates are semicircular, and diameter sides of the two permanent magnet plates are movable to abut each other; a top end of an arc side of each of the permanent magnet plates is hinged at the opening; and
   a region of the arc side of each of the permanent magnet plates, which region is close to the diameter side of the each of the permanent magnet plates, is snap-fitted at the opening.

9. The filling method according to claim 8, wherein an inert gas is filled in the filling bottle in a sealed state to discharge air in the filling bottle before the evaporation material is filled in the filling bottle.

10. The filling method according to claim 8, wherein the vacuum evaporation space is vacuumed until a subatmospheric pressure opens the magnetic cover plate, then the magnetic cover plate is attracted by the magnetic induction drive unit to fully open the magnetic cover plate.

11. The filling method according to claim 9, wherein the vacuum evaporation space is vacuumed until a subatmospheric pressure opens the magnetic cover plate, then the magnetic cover plate is attracted by the magnetic induction drive unit to fully open the magnetic cover plate.

12. The filling method according to claim 11, wherein the direction of the magnetic field generated by the magnetic induction drive unit is changed to repulse back and close the magnetic cover plate.

13. The filling method according to claim 8, wherein the evaporation material comprises an evaporation organic material or an active metal.

14. The filling method according to claim 8, wherein an end of a drainage tube is connected with an opening of the filling bottle, other end of the drainage tube orientates the evaporation material trough; the evaporation material enters into the evaporation material trough through the drainage tube.

15. The filling method according to claim 8, wherein the magnetic induction drive unit comprises a pair of electromagnets configured that the electromagnets generate the magnetic field upon the electromagnets being electrified, and the magnetic cover plate is located in a magnetic field.

* * * * *